United States Patent [19]
Wen

[11] Patent Number: 5,937,280
[45] Date of Patent: Aug. 10, 1999

[54] METHOD OF MANUFACTURING A ROM

[75] Inventor: Jemmy Wen, Hsinchu, Taiwan

[73] Assignee: United Microelectronics Corp., Taiwan

[21] Appl. No.: 08/839,363

[22] Filed: Apr. 18, 1997

[30] Foreign Application Priority Data

Jan. 15, 1997 [TW] Taiwan ................................. 86100401

[51] Int. Cl.⁶ .............................................. H01L 21/8246
[52] U.S. Cl. ......................... 438/130; 438/237; 438/275; 438/278
[58] Field of Search .................................... 257/910, 390, 257/391; 438/128, 130, 237, 275, 276, 277, 278

[56] References Cited

U.S. PATENT DOCUMENTS

| | | | |
|---|---|---|---|
| 4,727,409 | 2/1988 | Conner et al. | |
| 5,272,370 | 12/1993 | French | 257/353 |
| 5,426,066 | 6/1995 | Fu et al. | 438/237 |
| 5,441,907 | 8/1995 | Sung et al. | 438/237 |
| 5,825,069 | 10/1998 | Wen et al. | 257/910 |
| 5,843,824 | 12/1998 | Chou et al. | 438/278 |

*Primary Examiner*—Mary Wilczewski
*Attorney, Agent, or Firm*—Rabin & Champagne, P.C.

[57] ABSTRACT

A ROM structure and its method of manufacture using separate parallel trench bit lines for increasing memory component density as well as using a diode as the fundamental memory unit, each diode having a junction formed inside a bit line with a forward biased voltage of about 0.4 V and a reverse biased voltage dependent upon the doping condition in an N⁻ region. At a junction between a word line and a bit line, either an ON state or an OFF state diode memory unit is created depending on whether a contact opening in the insulating layer for connection between the two is formed or not. When a definite operating voltage is applied to the word line, the stored information bit in the diode memory unit can be read off from the bit line by sensing a cut-off or a conducting current representing previous program coding of the diode memory unit.

10 Claims, 7 Drawing Sheets

METHOD OF MANUFACTURING A ROM

BACKGROUND OF THE INVENTION

1. Field of the Invention

This invention relates in general to a structure and method of manufacturing read only memories (ROMs), and more particularly to a structure and method of manufacturing a ROM with diode memory units located in separate parallel trench-like bit lines that can be programmed to either an ON state or an OFF state through processing and having the additional benefit of an increased ROM density.

2. Description of the Related Art

ROMs are now widely used in digital equipment such as microcomputers and microprocessor operating systems. Resident programs used by the operating systems, such as BIOS, (Basic Input/Output System) are normally kept in ROMs. Due to rather complicated manufacturing processes for ROMs involving a lot of time performing steps and material processing, generally customers will submit their program codes to a memory manufacturer, and then the manufacturer generates masks accordingly, before coding the information into semi-finished memory taken from warehouse stock.

To a certain extent, the designs of modern memories are limited by the advances in semiconductor manufacturing technologies, and therefore any further reduction of the feature size of memory units requires continued improvements in the repertoire of manufacturing techniques. Conventional ROMs are composed of a matrix of metallic oxide semiconductor field effect transistors (MOSFETs) with each field effect transistor representing one memory cell unit. Each field effect transistor so formed provides one of two characteristic selected values for the transistor. For example, one such characteristic is the threshold voltage of the transistor. By implanting impurities into the channel region of a transistor, the transistor will have a lower threshold voltage and can be switched open more readily when a gate voltage Vcc is applied. Without any impurities implanted in the channel region of a transistor, the transistor will have a higher threshold voltage and therefore will not be turned on by the application of the same gate voltage Vcc. Through the selective implantation of impurities into the channel regions of transistors, binary data bits are stored in the memories. Those transistors having a channel implantation can represent the storage of a logic "0", while those transistors having no channel implantation can represent the storage of a logic "1".

FIG. 1A is a top view of part of a conventional ROM. The ROM consists of a plurality of separate parallel bit lines 12a~12c embedded beneath field oxide areas 200 and acting as the source/drain diffusion regions for the transistors. These bit lines, together with the different impurity concentrations doped between the lines, determine whether data bits "0" or "1" are stored in the resulting memory units. Referring to FIG. 1A, memory transistor units 16a and 16d are in an ON state while units 16b and 16c are in an OFF state. Overlying and running across the bit lines are a plurality of parallel word lines such as word lines 18 (WL1) and 18' (WL2), through which the stored data are accessed by the application of a voltage. FIG. 1B is a perspective view of part of the cut-out section along the section line II—II of FIG. 1A. The section consists of a P-type semiconductor substrate 10, embedded bit lines 12a, 12b and 12c beneath the field oxide areas 200, a thin insulating area 14 and word lines 18 and 18' crossing over the bit lines. FIG. 1C is an equivalent circuit diagram corresponding to the ROM unit shown in FIG. 1B.

The ROM specified above uses a channel transistor as its fundamental memory unit. Therefore, a rather large volume is occupied by each individual component, and in addition, in the process of miniaturizing component dimensions, the short channel effect emerges, resulting in a rather large leakage current. Besides, the operating current of the memory is limited by the threshold voltage (Vt) of the transistor, and hence when the word line is operating at a low voltage, the starting current of the memory transistor may be too weak to differentiate separate data bits in read/write operations.

SUMMARY OF THE INVENTION

It is therefore an object of the invention to provide a high density ROM structure that fully utilizes space, increases the memory component density without a corresponding reduction in dimensional resolution, and also can differentiate between separate data bits stored in each memory unit even under a low operating voltage.

The high density ROM according to the invention has a structure that includes a plurality of separate parallel bit lines formed inside a semiconductor substrate, and a pad oxide layer/first insulating layer structure formed above the substrate and between the bit lines. A second insulating layer is formed on the sidewall surfaces of the bit lines. A third insulating layer is formed above the first insulating layer and the bit lines. A plurality of separate parallel conducting lines are formed above the third insulating layer and run across the bit lines to serve as the word lines for the memory. A diode memory unit having either an ON or an OFF state is provided at a junction crossing between a bit line and a word line.

The method for manufacturing the ROM structure of this invention includes forming a pad oxide layer and a first insulating layer in sequence above a first conductivity-type semiconductor substrate. Using photolithographic and etching techniques, and with the first insulating layer as an etching mask, the substrate is etched to form a plurality of separate parallel trenches inside the semiconductor substrate. A second insulating layer is then formed on the sidewall surfaces of the trenches. A polysilicon layer, heavily doped with carriers of a second conductivity-type, is formed above the substrate, after which an etch back is performed, leaving behind a first polysilicon layer having a suitable thickness at the lower part of the trenches.

A polysilicon layer lightly doped with carriers of the second conductivity-type is then formed above the substrate, after which an etch back is performed using the first insulating layer above the substrate as the etch end point, thus forming a second polysilicon layer inside the trench just above the first polysilicon layer, whereby the first and second polysilicon layers together constitute a first implantation region and form bit lines. First conductivity-type carriers are then implanted into the substrate and a second shallow junction implantation region is formed above the surface of the polysilicon layer. A first conductivity-type bit line insulating barrier is formed between the bit lines. A thick third insulating layer is formed above the first insulating layer and the bit lines. A contact opening is then formed at the junction between where a word line will cross the bit line where an ON state diode memory unit is desired. Then, a plurality of separate parallel conducting lines, acting as the word lines for the memory, are formed above the insulating layer so as to cross the bit lines, and thereby form at each junction where a bit line and a word line cross a diode memory unit having either an ON state or an OFF state.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
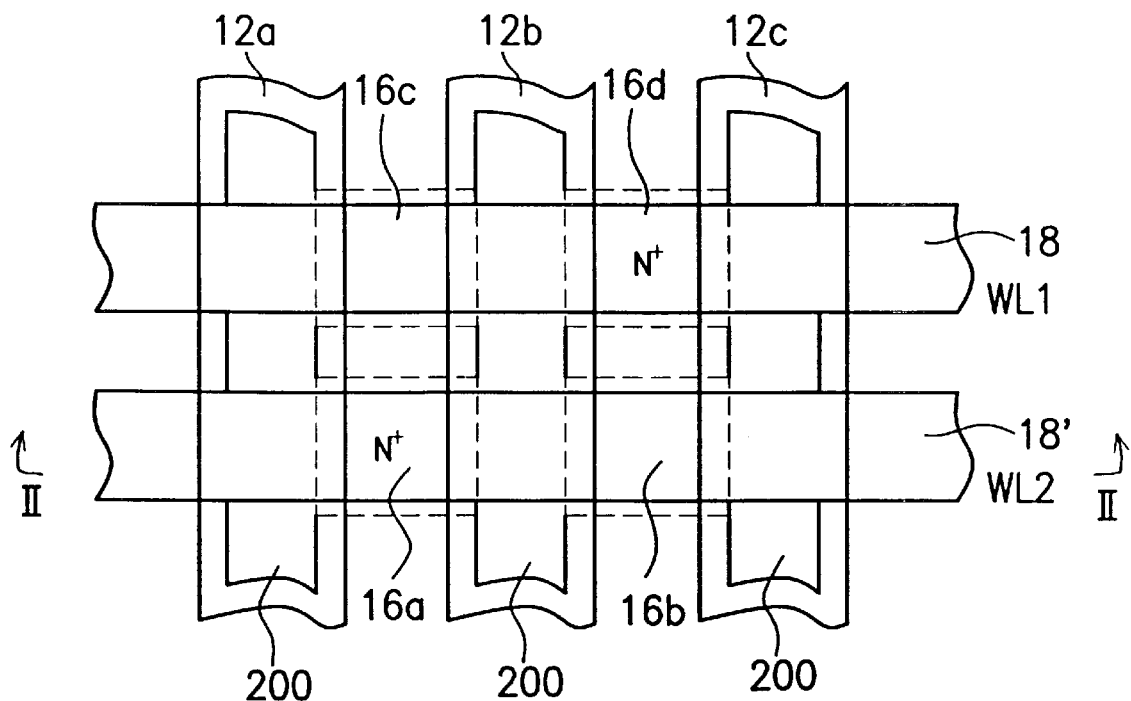
FIG. 1A is a top view showing a conventional ROM.
Figure 1B:
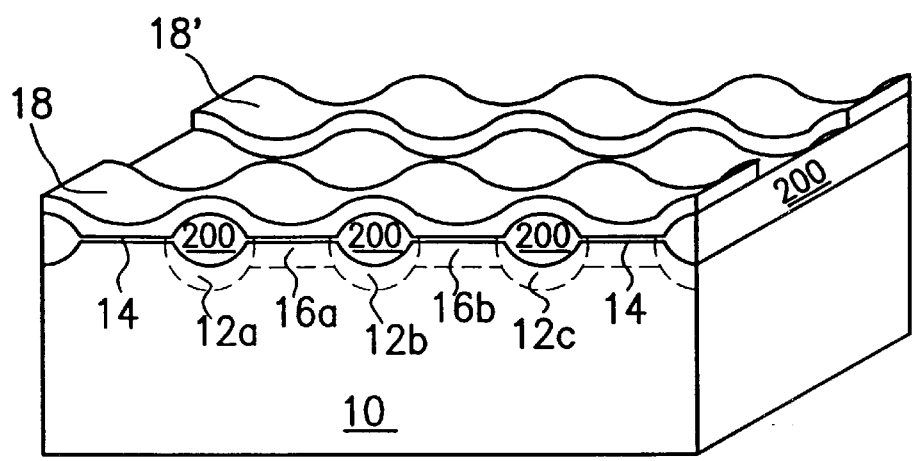
FIG. 1B is a perspective view showing part of the cut-out portion along cross section line II—II of FIG. 1A.
Figure 1C:
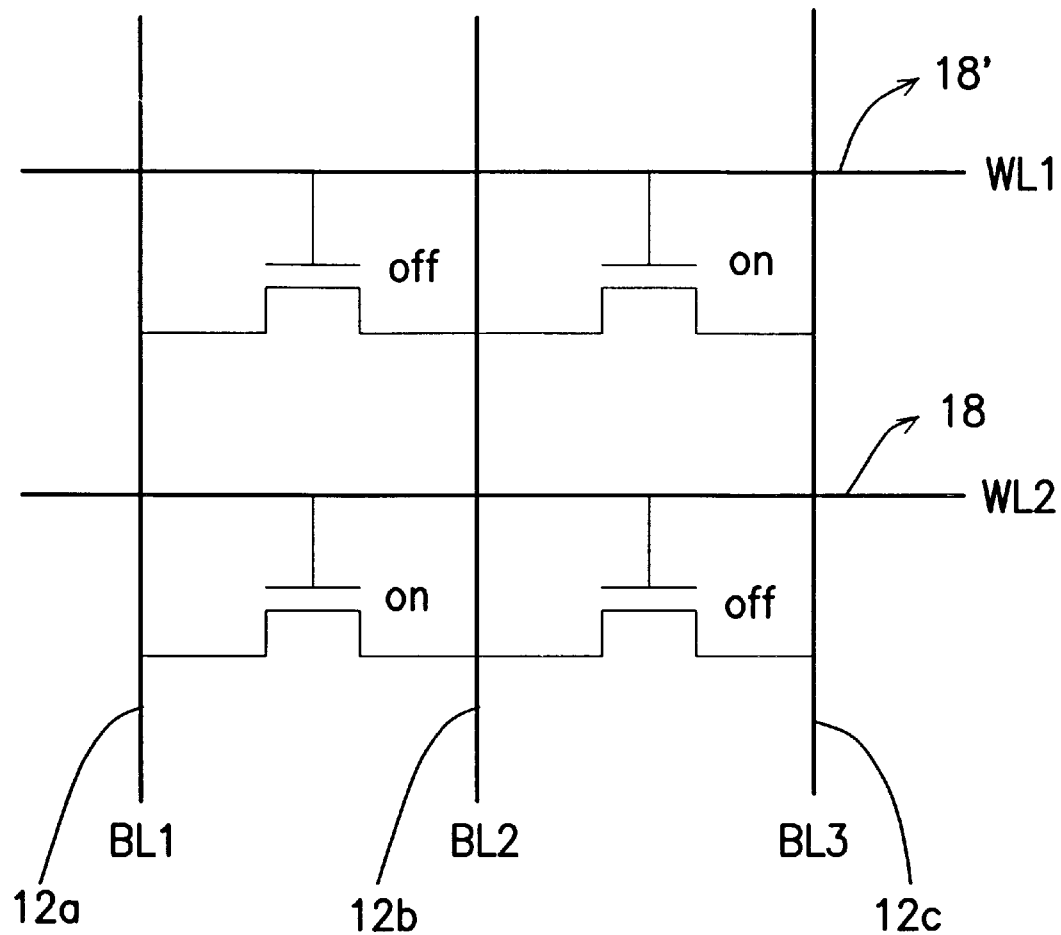
FIG. 1C is an equivalent circuit diagram corresponding to FIG. 1A.
Figure 2A:
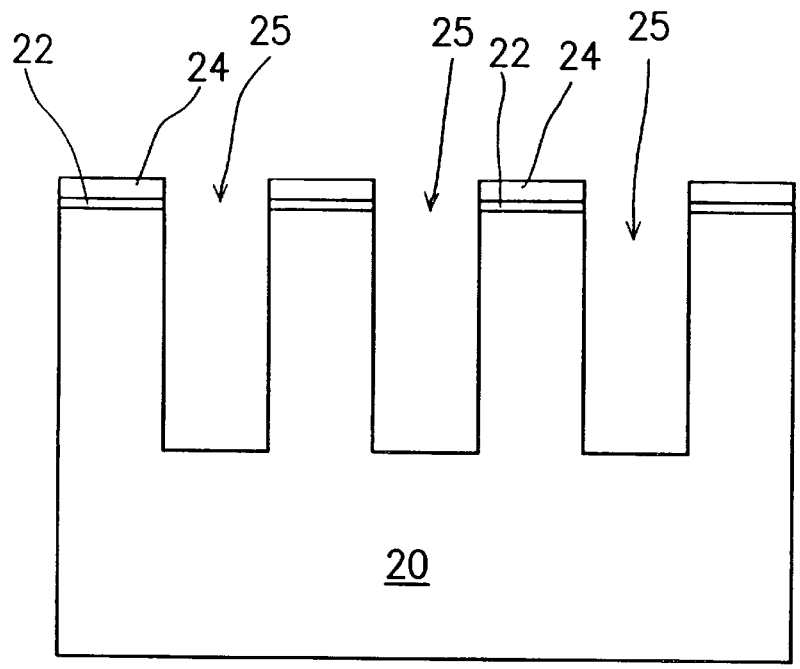
FIGS. 2A through 2G are a series of cross-sectional views showing the manufacturing flow of a ROM according to this invention.

Referring to FIG. 2A, a pad oxide layer 22 and a silicon nitride insulating layer 24 are formed in sequence above a semiconductor substrate 20, for example, a P-type silicon substrate. Then, using photolithographic and etching processes, with a silicon nitride layer 24 serving as a mask, a plurality of separate parallel trenches 25 (reserved for the laying of bit lines of the ROM) are formed inside the P-type silicon substrate 20.

Figure 2B:
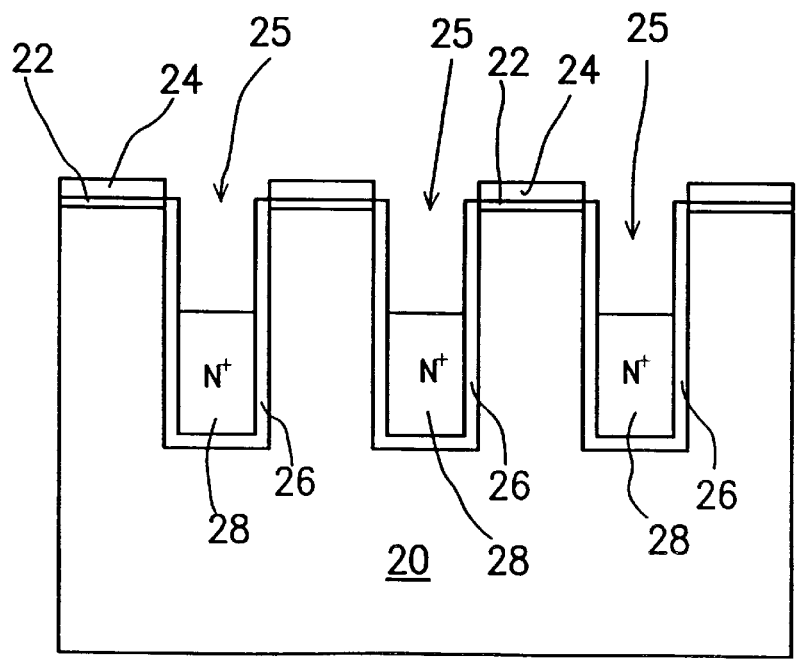

Referring next to FIG. 2B, a thin insulating layer 26, such as a thin silicon dioxide layer, is formed on the exposed sidewall surfaces of trenches 25. Then, an $N^+$ polysilicon layer 28 containing heavily doped N-type carriers is formed inside the trenches 25, wherein the N-type carriers can be selected from among N-type impurities such as arsenic and phosphorus. Thereafter, the $N^+$ polysilicon layer inside the trenches is etched back to maintain the layer at a suitable thickness.

Figure 2C:
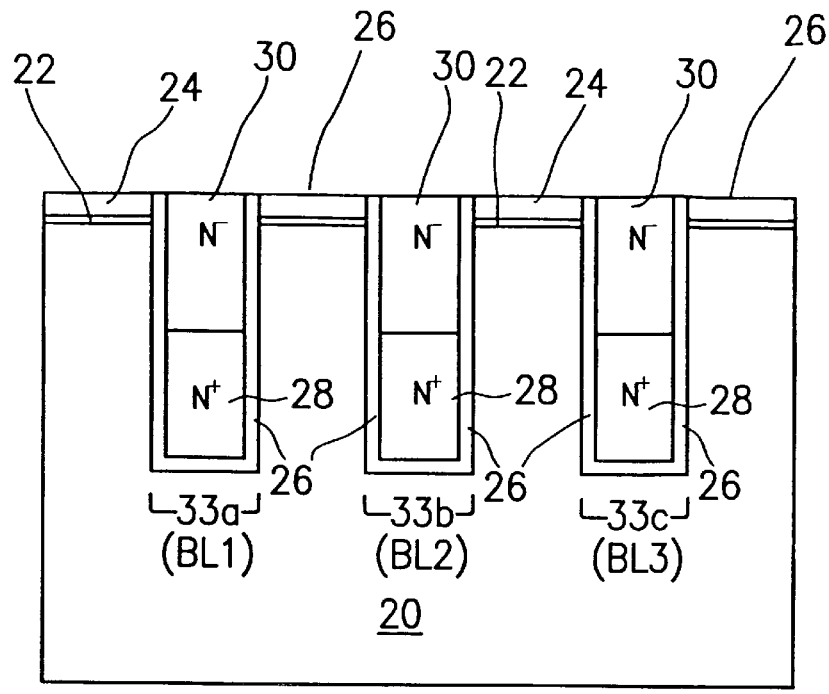

Referring next to FIG. 2C, in the subsequent step an $N^-$ polysilicon layer 30 containing lightly doped N-type carriers is deposited above the thin insulating layer and the $N^+$ polysilicon layer 28 inside the trenches. Then, the $N^-$ layer is etched back using the silicon nitride layer 24 as the etch end point, such that there is an $N^+$ polysilicon layer 28 containing heavily doped N-type carriers at the bottom of the trenches and an $N^-$ polysilicon layer 30 having lightly doped N-type carriers immediately above in the upper part of the trenches. As a result, N-type implanted bit lines 33a (WL1), 33b (WL2) and 33c (WL3) are formed.

Figure 2D:
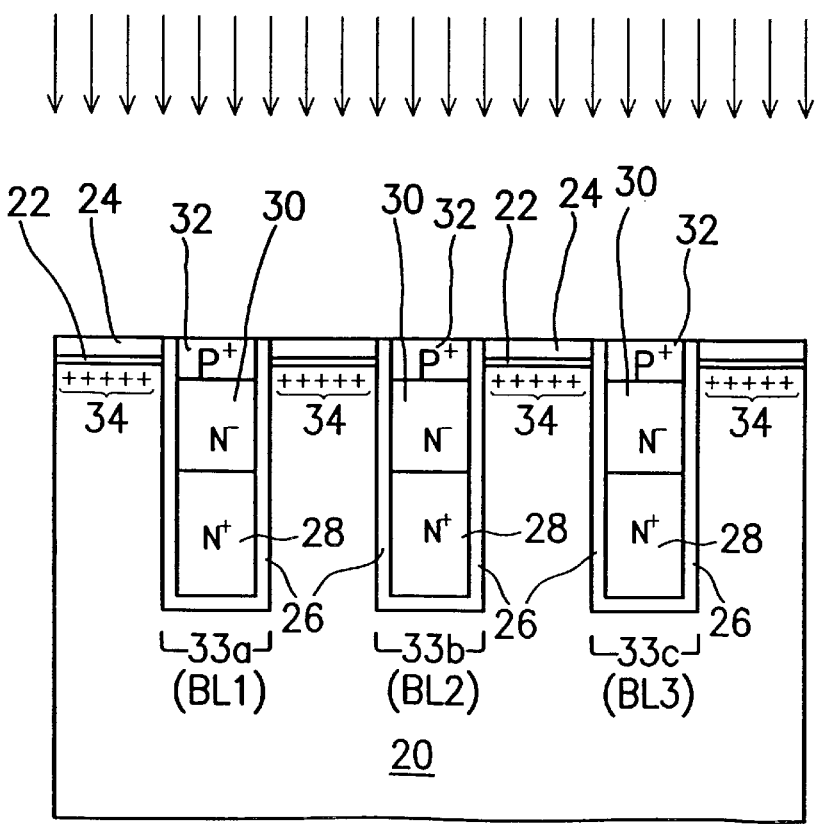

Referring next to FIG. 2D, a shallow $P^+$-type implantation region 32 is formed above the $N^-$ layer 30, thus forming a P-N junction diode structure in the bit lines 33a~33c. The shallow $P^+$-type implantation region 32 is formed by a low energy/high dosage implantation of P-type carriers selected from among boron, boron fluoride and boro-methane, into the $N^-$ layer 30 inside the bit lines. The forward biased voltage for the P-N diode is about 0.4 V while the reverse breakdown voltage is controlled by doping in the $N^-$ layer. Also, $P^+$-type bit line isolating barrier regions 34 are formed through the implantation of a second conductivity-type carriers into the semiconductor substrate between the bit lines. These isolating barriers serve to prevent current from leaking out through regions between the bit lines. The P-N diode structures form diode memory unit regions.

Figure 2E:
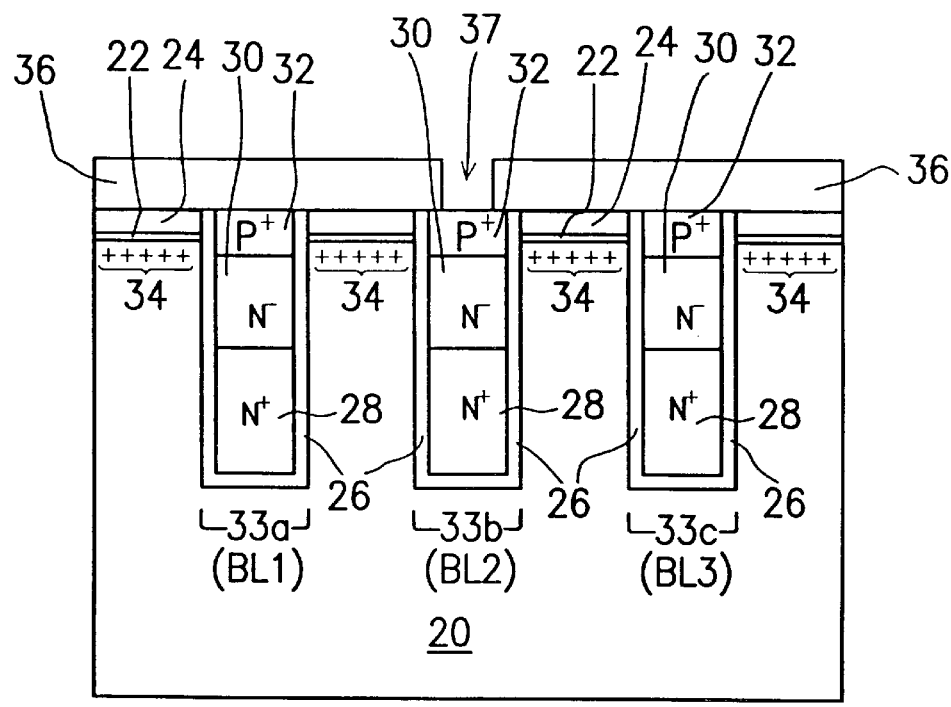

Referring next to FIG. 2E, subsequently a thick insulating layer 36, for example, a silicon dioxide layer, is formed above the silicon nitride layer 24 and the $P^+$type implantation region 32 of the bit lines, and then using photolithographic and etching techniques, a contact window 37 is formed above the diode memory unit regions along the bit lines designated to be in an ON state.

Figure 2F:
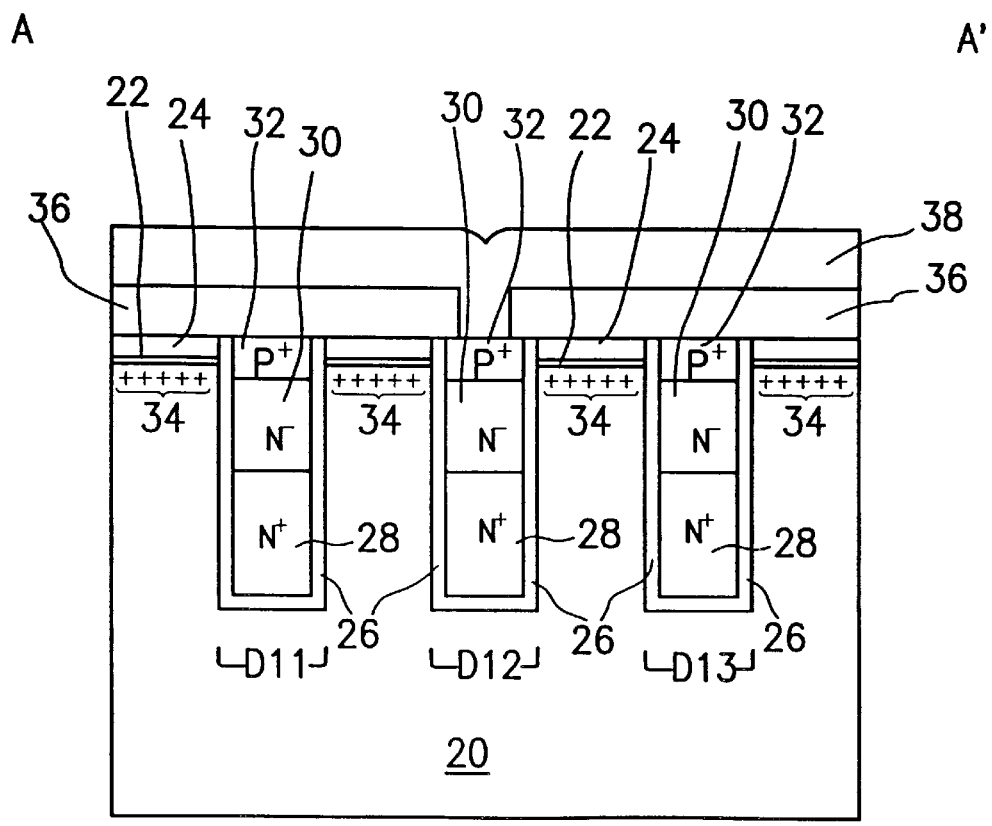

Finally, referring to FIG. 2F, a plurality of separate parallel word lines (WL) running across the bit lines are formed above the insulating layer 36 using material chosen from among polysilicon, aluminum, tungsten and titanium. Shown in the figure is one of the word lines 38 connected to the $P^+$-type implantation region 32 of bit line 33b (BL2) through a contact window 37, and hence forming a diode memory unit D12 having an ON state. Since the $P^+$-type implantation regions 32 of bit lines 33a and 33c are covered by the insulating layer 36 and do not have any contact opening for connection to the word line, both diode memory units D11 and D13 are regarded as having an OFF state. Through this, there is provided a ROM consisting of an array of diode memory units programmed by forming or not forming a contact opening in the insulating layer above the bit line for connection to the word line, during the processing operation. A perspective view of such a ROM is shown in FIG. 2G.

Figure 2G:
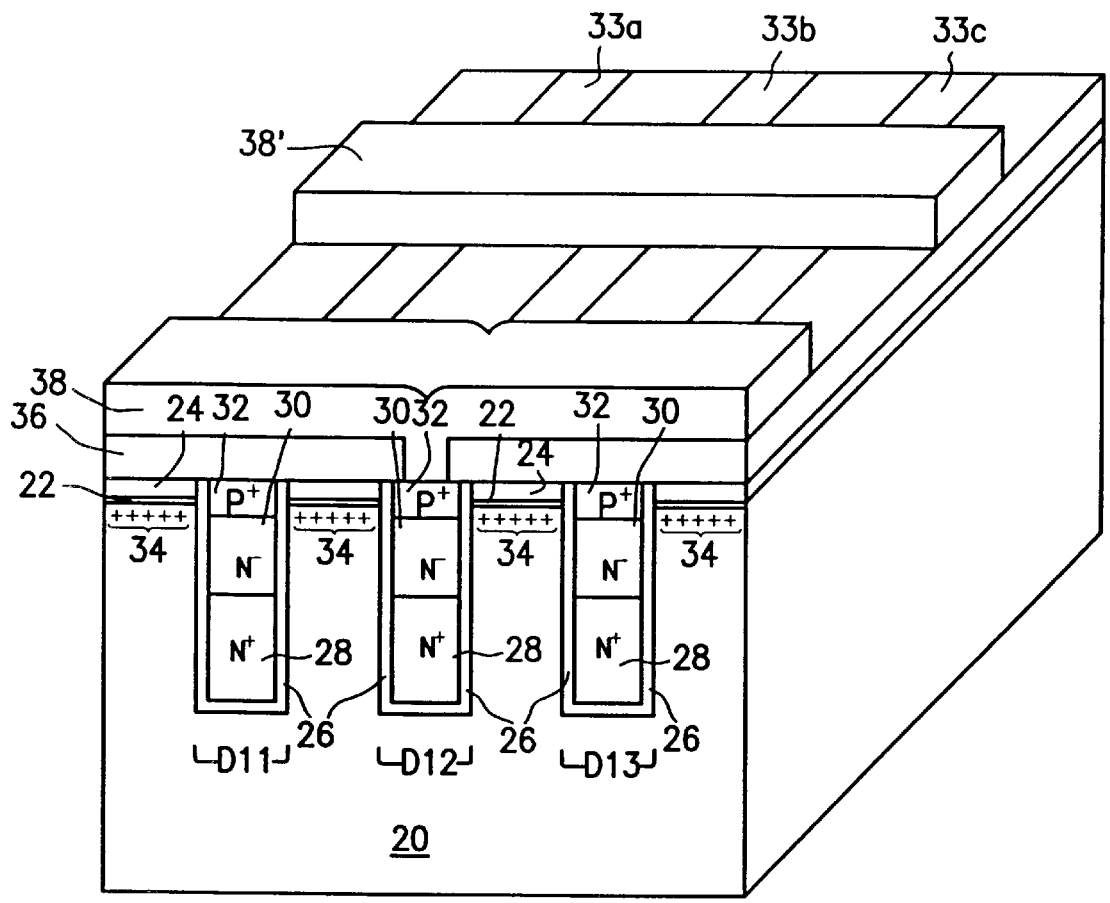
Figure 3A:
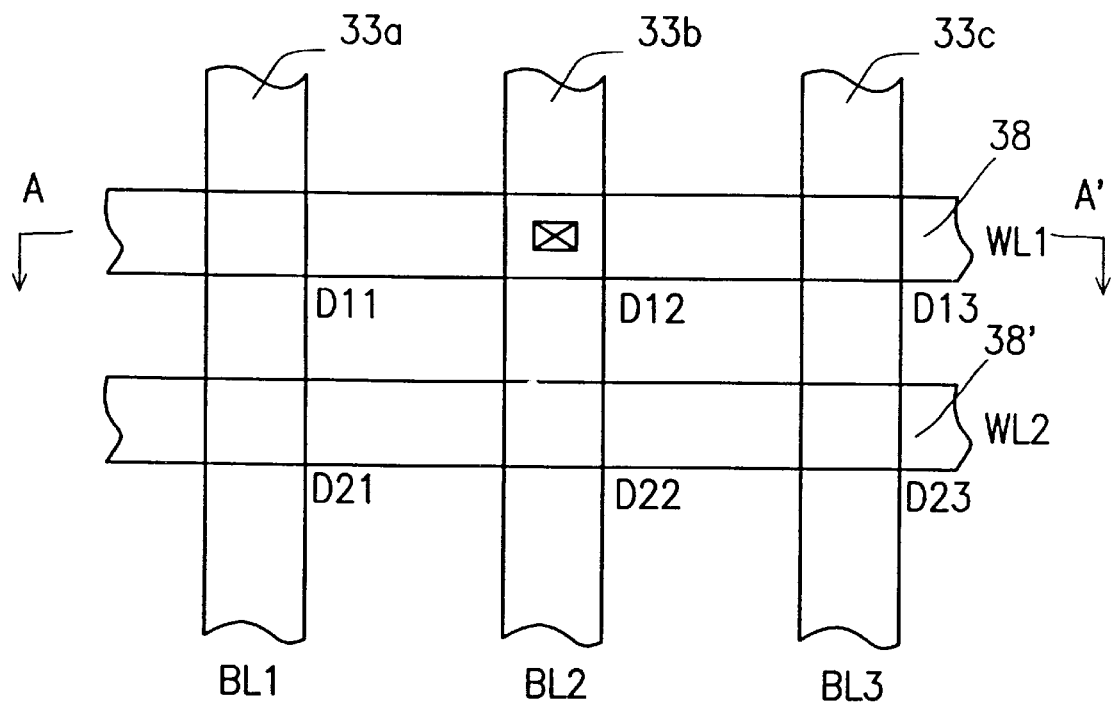
FIG. 3A is a top view showing a ROM according to FIG. 2F.
Figure 3B:
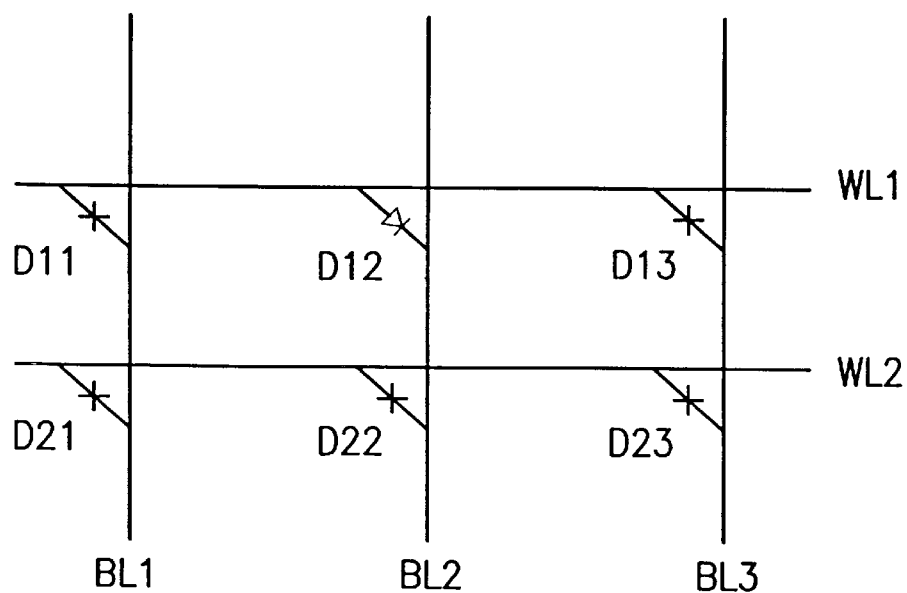
FIG. 3B is an equivalent circuit diagram corresponding to FIG. 3A.

FIG. 3A is a top view of the ROM structure shown in FIG. 2G. In the figure, bit lines are labeled 33a (BL1), 33b (BL2) and 33c (BL3) and word lines are labeled 38 (WL1) and 38' (WL2) respectively. At the junction between each word line and bit line, a memory unit is located. The memory units having a contact window with connection of the bit line to the word line form ON state diode memory units such as unit D12, while those memory units not having a contact window for connection of a bit line with the word line are OFF state diode memory units such as units D11, D13, D21, D22 and D23. The corresponding equivalent circuit diagram for FIG. 3A is shown in FIG. 3B. The principles of operation for the high density ROM according to this invention are explained by the following example:

When a positive voltage is applied to word line WL1 with bit line BL2 grounded, since diode unit D12 is in an ON state, current can flow into bit line BL2, and when current is detected in bit line BL2, the memory unit can be regarded as being in a logic state of "1".

When a positive voltage is applied to word line WL2 with bit line BL2 grounded, since diode unit D22 is in an OFF state, current cannot flow into bit line BL2, and when no current is detected in bit line BL2, the memory unit can be regarded as being in a logic state of "0".

In summary, the ROM structure of this invention acts according to the distinct controlling voltages applied to the word lines 38 such that a conducting pathway to a selected bit line is established, with all of the remaining bit lines held in a floating state. The forward biased voltage for the diode memory units is about 0.4 V, and no detectable current is sensed when the memory unit is in the OFF state. This method of using a distinct word line voltage to select a particular memory unit on the bit line is capable of storing data bits such as "0" and "1". In addition, the use of the trench bit lines together with the use of diodes instead of metallic oxide semiconductor (MOS) field effect transistors in a conventional ROM, not only can increase the memory component density, but also can prevent the defects that may occur in the conventional ROM while transferring information as a result of a low operating voltage for the MOS memory components. Such defects can be prevented in the invention because of the intrinsic low operating voltage demanded for diodes. Furthermore, the barrier insulating regions located between the bit lines are capable of stopping leakage current from occurring as a result of miniaturization of component dimensions. Also, the heavy doping of bit lines has the advantage of reducing its wiring resistance, while the lightly doped diode junction has the advantage of increasing its reverse breakdown voltage and thus reducing its reverse leakage current and raising its operating voltage level.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for manufacturing a ROM, comprising forming a pad oxide layer and a first insulating layer in sequence above a first conductivity-type semiconductor substrate;

using photolithographic and etching techniques, and with the first insulating layer as an etching mask, etching the substrate to form a plurality of separate parallel trenches inside the substrate;

forming a second insulating layer on sidewall surfaces of the trenches;

forming a polysilicon layer heavily doped with second conductivity-type carriers above the substrate, followed by etching back leaving behind a first polysilicon layer at a lower part of the trenches;

forming a polysilicon layer lightly doped with second conductivity-type carriers, above the substrate and the first polysilicon layer, and then etching back using the first insulating layer above the substrate as an etch end point, thus forming a second polysilicon layer inside the trench just above the first polysilicon layer;

forming in the second polysilicon layer a shallow first implantation region of the first conductivity type, thereby forming a plurality of separate parallel trench bit lines within the substrate, the bit lines having a junction diode structure;

implanting first conductivity-type carriers in the substrate to form a first conductivity-type bit line insulating barrier between the bit lines;

forming a thick third insulating layer above the first insulating layer and the bit lines;

forming a contact opening at a junction between where a word line is to be formed crossing a bit line and where an ON state diode memory unit is desired; and forming a plurality of separate parallel memory word lines, above the insulating layer and crossing the bit lines, so as to form a diode memory unit having either an ON state or an OFF state where the bit lines and word lines cross.

2. A method according to claim 1, wherein the first conductivity-type is N-type and the second conductivity-type is P-type.

3. A method according to claim 1, wherein the first conductivity-type is P-type and the second conductivity-type is N-type.

4. A method according to claim 1, wherein the third insulating layer at the junction has a contact window opening exposing the surface of the bit line therebelow, such that the word line is connected to the bit line through the contact opening, and forms a diode memory unit in an ON state.

5. A method according to claim 1, wherein the third insulating layer at the junction does not have a contact opening, and forms a diode memory unit in an OFF state.

6. A method according to claim 1, wherein a reverse biased operating current in the ROM is adjustable by controlling a concentration ratio between the second conductivity-type implantation and the first conductivity type implantation in the bit line junction diode structure.

7. A method according to claim 1, wherein each diode memory unit having an ON state is coded as an information bit "1".

8. A method according to claim 7, wherein each diode memory unit having an OFF state is coded as an information bit "0".

9. A method according to claim 1, wherein each diode memory unit having an ON state is coded as an information bit "0".

10. A method according to claim 9, wherein each diode memory unit having an OFF state is coded as an information bit "1".

* * * * *